United States Patent [19]

Ordway

[11] Patent Number: 5,128,676
[45] Date of Patent: Jul. 7, 1992

[54] VARIABLE CONVERSION RATE ANALOG-TO-DIGITAL CONVERTER

[75] Inventor: Frank S. Ordway, Dedham, Mass.

[73] Assignee: BLH Electronics, Inc., Canton, Mass.

[21] Appl. No.: 533,678

[22] Filed: Jun. 5, 1990

[51] Int. Cl.$^5$ .............................................. H03M 1/50
[52] U.S. Cl. ..................................... 341/167; 341/166
[58] Field of Search .............. 341/167, 131, 167, 131, 341/168, 166, 127–129

[56] References Cited

U.S. PATENT DOCUMENTS

| | | | |
|---|---|---|---|
| 3,316,547 | 4/1967 | Ammann | 341/167 |
| 3,728,625 | 4/1973 | Senour et al. | 341/167 |
| 4,270,119 | 5/1981 | Mitamura | 341/167 |
| 4,366,874 | 1/1983 | Pidoux et al. | 341/167 |
| 4,568,913 | 2/1986 | Evans | 341/167 |
| 4,620,178 | 10/1986 | Naito | 341/167 |
| 4,644,323 | 2/1987 | Chamran et al. | 341/167 |
| 4,857,933 | 8/1989 | Knight | 341/167 |
| 4,908,623 | 3/1990 | Ullestad | 341/167 |

FOREIGN PATENT DOCUMENTS 0078030 3/1989 Japan .................................. 341/167

OTHER PUBLICATIONS

Dual-Slope Integrating Analog-to-Digital Converter With Digital Self-Calibration, Amemiya, Mar. 79, IEEE Tranactions on Instrumentation & Meas.

An Integrating ADC for Differential Transdcuers, Owen, Sep. 79, IEEE Transactions on Instrumentation & Measurement.

Primary Examiner—Howard L. Williams
Assistant Examiner—Brian Young
Attorney, Agent, or Firm—Fish & Richardson

[57] ABSTRACT

A high resolution and high speed analog to digital converter for use with a transducer in measuring parameters such as weight, which may stay the same or which may change in the system, the converter having an integrator which integrates for a fixed period the output voltage from the transducer, and subsequently deintegrates a known reference voltage, the deintegration times varying depending upon the magnitude of the transducer output voltage which has been integrated, a comparator comparing the deintegration times of successive conversions and shortening the integration times for the transducer output so as to obtain more conversions per time period to provide a high speed readout when the transducer output is changing, but lengthening the integration times to provide a high resolution readout when the comparison of deintegration times does not reveal any change in the transducer output.

14 Claims, 3 Drawing Sheets

5,128,676

VARIABLE CONVERSION RATE ANALOG-TO-DIGITAL CONVERTER

FIELD OF THE INVENTION

This invention relates to an apparatus for accurately measuring parameters which may change.

BACKGROUND OF THE INVENTION

In the prior art, measurements are made by using transducers which generate a voltage corresponding to temperature or force applied to them. This analog voltage is often converted to a digital signal for readout purposes.

The problem, however, is speed and accuracy. The parameter being measured may be in a steady state, or it may be changing rapidly. For example, in many systems, a transducer provides an analog voltage proportional to the parameter being measured. The digital output is based on an integration of the analog signal over a certain period of time, and in particular, the digital output reflects the average value of the analog output voltage over the integration period. As a result, under steady-state or near steady-state conditions, the accuracy of the digital readout will be greater with a longer integration period. Thus, where the measured parameter (e.g., weight) is not changing or is changing very slowly, the longer integration period provides a more precise digital readout.

The situation is different where the measured parameter is changing and perhaps changing rapidly. In those cases, high speed in obtaining the readout may be essential so that the ongoing process can be tightly controlled. Accuracy is important in this measurement, but speed is more critical, and as a result, a much shorter integration period is used so the results are available faster. Consequently, high speed and high accuracy are somewhat mutually exclusive in these analog-to-digital measurement systems.

The particular problem that exists in the art is when the system to be measured has phases where the parameter to be measured has both steady state or near steady state conditions as well as rapidly changing ones. An example would be an industrial vat that is being filled with several liquids, with the filling process shutting off based on the weight of the liquids in the vat. This is often done in making paint where the vat is partially filled with one liquid and then completely filled with others. The process is controlled by the weight of the vat, and it must be strictly controlled or else the color of the paint will not be consistent from vat to vat. While the vat is initially being filled with one liquid, rapid weight readouts are needed to monitor that operation closely so as to fill the vat as quickly as possible but also to reduce the flow at precisely the proper time so that neither too much nor too little of the liquid will be added. In such cases, the prior art makes a compromise with the analog-to-digital converter responsible for the measurement. The prior art simply selects one integration time which is below the optimum integration time for high resolution (long integration time) and above that for high speed (short integration time) conditions. Consequently, the device is not particularly good for either condition.

As a result, an object of this invention is to provide an analog-to-digital converter for a measurement system which provides, based on the changes or steady state nature of the measured value, high resolution in a steady state or near steady state condition and rapid readouts in changing conditions.

SUMMARY OF THE INVENTION

We have discovered an apparatus and a method for measuring steady-state conditions accurately and changing conditions quickly and for doing so in connection with an analog-to-digital conversion process. Specifically, the integration and deintegration of the analog measurement voltage are compared on successive conversions to determine if any change has occurred in the input voltage. If it has, the invention shortens the integration time for the analog measurement voltages and maintains that shortened integration time until the input voltage is no longer changing.

In the preferred embodiment, a transducer, which can measure the parameter in question, provides an output in the form of an analog voltage. The magnitude of the voltage is directly proportional to the force being measured (e.g., weight). That voltage is applied to an integration circuit which integrates the voltage from the transducer for a preselected (fixed) period of time. When that time period is over, a known reference voltage of opposite polarity to the analog voltage from the transducer is switched to the integration circuit, which because of its polarity, is deintegrated. The time for the deintegration depends on and is directly related to the magnitude of the input voltage from the transducer. The higher that analog voltage is, the greater it charges the capacitor associated with the integration circuit and the longer it takes the reference voltage to discharge it.

A microcomputer, however, compares successive conversions, and in particular, determines the magnitude of their analog voltages from a comparison of their deintegration times. If the input voltage is changing (whether increasing or decreasing) more than a preselected amount, the microcomputer sends a signal to the switching circuit for the integration circuit to reduce the integration time (to a second, shorter fixed period). The conversions are made more rapidly (by a factor of three in the preferred embodiment) and the readouts are provided more quickly. The microcomputer continues to compare the deintegration times for successive conversions, and when it determines that the analog voltages being integrated are the same, it again alters the timing of the integration periods by increasing it. The relative increase or decrease can be any amount depending on the magnitude of the change in the analog input voltage, or it can be set to provide only a few such time periods, one for a changing analog input voltage and one for a steady state condition.

As a result, the invention provides an analog to digital conversion whereby the results are provided rapidly for changing conditions and which are provided very accurately for steady state ones.

DESCRIPTION OF THE PREFERRED EMBODIMENTS

We hereinafter turn to the preferred embodiment of the invention, after first describing the drawings.

STRUCTURE

Figure 1:
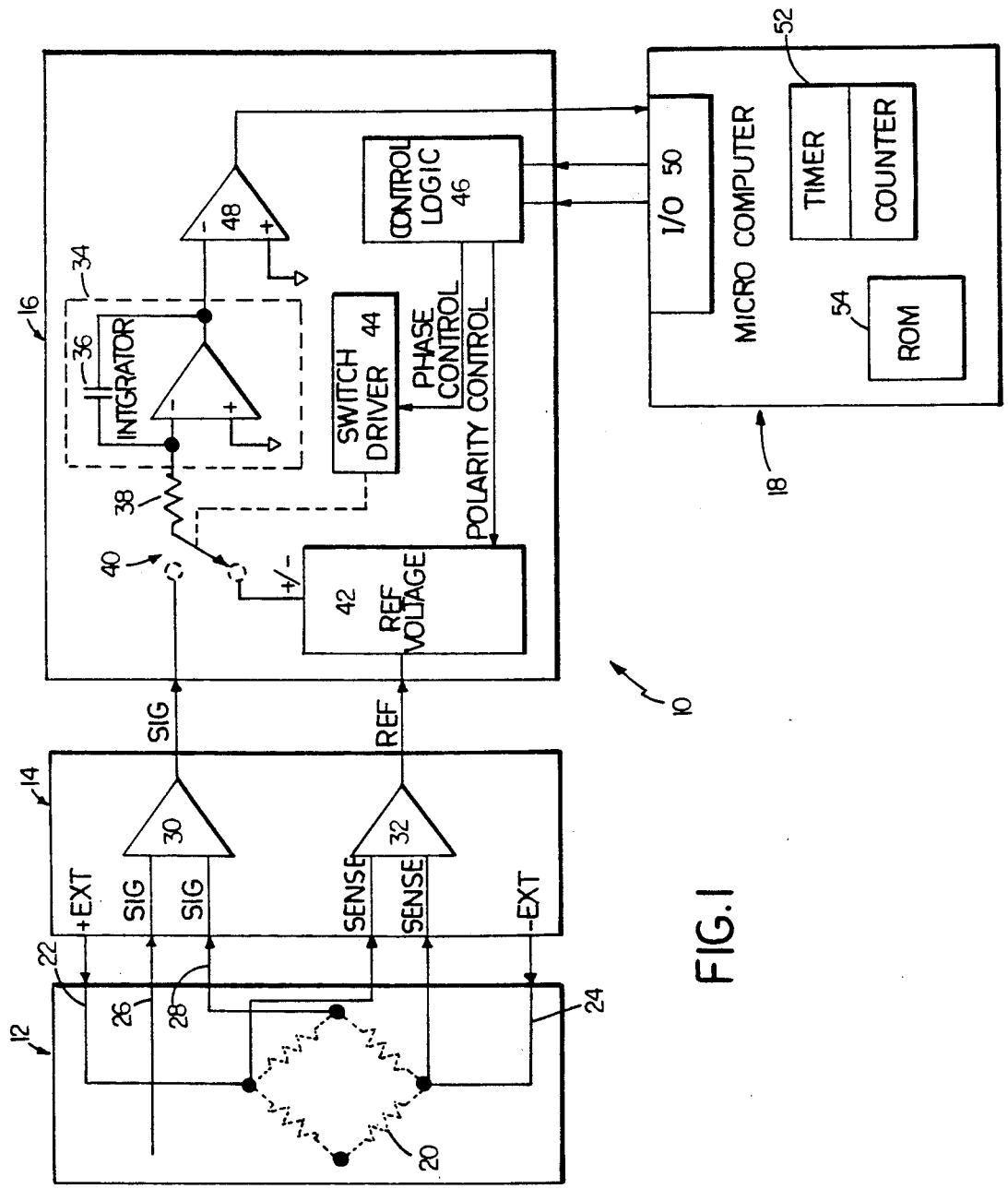
FIG. 1 is a block diagram of the invention.

Referring to FIG. 1, the circuit of this invention is shown at 10 in the form of a block diagram. The circuit generally comprises a transducer 12, an amplifier circuit 14, an A to D converter 16 and a microcomputer 18. A display for showing the readout is not shown, but it would be connected as an output of the microcomputer 18.

The transducer 12 may be any type of measurement transducer which provides an analog voltage for its output. A load-cell type of transducer is shown here for illustration purposes only. In that transducer, a strain gauge 20 is bonded so as to translate the force to be measured into changes in electrical resistance. Two external operational voltages of opposite polarity (+EXT. and −EXT.) are supplied to opposite ends of the strain gauge 20 by the amplifier circuit 14 through wires 22, 24. The remaining two ends of the strain gauge provide the analog voltage output signal (SIG) from the transducer 12, which voltage is proportional to the force applied to the strain gaugue 20. Other types of transducers may, of course, be used.

The output signal (SIG) from the transducer 12 is carried by wires 26, 28 to the amplifier circuit 14. As shown in FIG. 1, the output signal (SIG) is fed to a first amplifier 30, the output of which is sent to the analog to digital converter 16. The amplifier circuit 14 also receives a sense signal (SENSE), which is a voltage from the transducer 12, specifically taken from the opposite ends of the strain gauge 20 from which the output signal (SIG) is obtained. The sense signal is fed to a second amplifier 32, which in turn provides a known reference voltage (REF) to the A to D converter 16.

The A to D converter 16 essentially comprises an integrator 34 with an associated capacitor 36. The input of the integrator is connected through a resistor 38 to a bi-polar switch 40. The two poles of the switch 40 provide two possible inputs to the integrator 34. Depending on the state of the switch 40, the analog signal voltage (SIG) from the first amplifier 30, which voltage reflects the magnitude of the force being applied to the strain gauge 20 of the transducer 12, or the output of a reference voltage circuit 42 is connected to the input of the integrator 34. A switch driver 44 controls the operation of the switch 40, and the switch driver 44 is in turn controlled by and connected to a control logic circuit 46. The control logic circuit 46 is also connected to the reference voltage circuit 42. The output of the integrator 34 is fed to a comparator 48, the output from which is the output of the A to D converter 16. The A to D converter may be a TSC500 Integrating Converter Analog Processor.

The microcomputer 18 has an interface unit 50, a timer/counter 52 and a read-only-memory 54. The microcomputer receives the output of the comparator 48 of the A to D converter 16 and provides inputs to the control logic circuit 46 of the A to D converter 16.

The microcomputer may be a 80C31 microcontroller.

OPERATION

The operation of the circuit 10 can best be understood first by reference to FIG. 1 Generally, the transducer 12 produces an analog output voltage proportional to the strength of the force that is exerted on it. If the force (e.g., weight) is constant, this voltage (designated SIG) will be constant. If the force is changing, the voltage will similarly change. That voltage (SIG) is amplified by the first amplifier 30, and it is provided to one pole of the bi-polar switch 40 of the A to D converter.

The amplifier circuit 14, which provides the excitation voltage (EXT and −EXT) for the transducer 12, also senses that voltage at the inputs of the strain gauge 20, and that sensed voltage (SENSE) is amplified by the second amplifier 32. The output of that amplifier 32 is a reference voltage (REF) which is sent to the reference voltage circuit 42 of the A to D converter 16.

Figure 2:
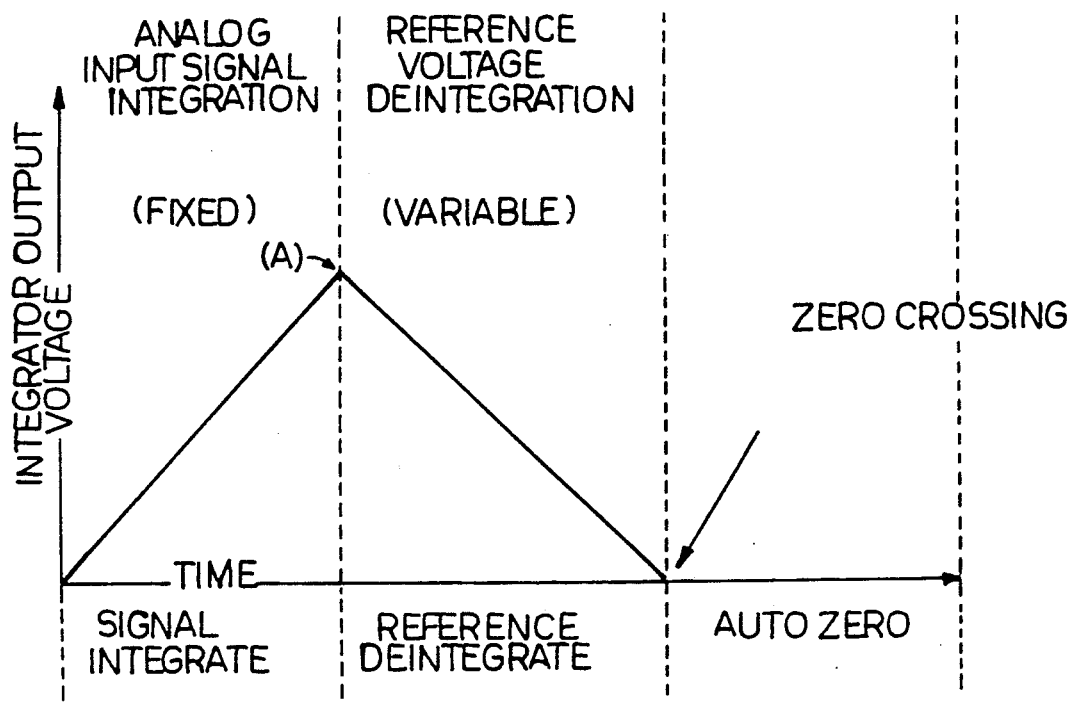
FIG. 2 is a diagram of a waveform of a single analog to digital conversion from integrating a analog input voltage and deintegrating a preselected reference voltage.

The switch 40 of the A to D converter 16 determines whether the signal voltage (SIG) or the reference voltage (REF) voltage is provided to the input of the integrator 34 for integration. With reference to FIG. 2, a single analog to digital conversion has three parts. The first labeled SIGNAL INTEGRATE in the drawing is the integration phase. In that, the microcomputer 18, acting through the control logic circuit 46 and switch driver 44, causes the switch 40 to pass the amplified output voltage (SIG) from the transducer 12 to the input of the integrator 34. In this phase, the voltage (SIG) is integrated by the integrator 34, charging the associated capacitor 36. The integration (and the charging) is done for a preselected (fixed) period of time $T_1$ also determined by the timer/counter 52 of the microcomputer 18. The timer/counter 52 counts clock pulses to determine this period. Specifically, the timer/counter 52 initially tells the control logic circuit and the switch driver 44 that the switch 40 should be positioned so that the analog voltage (SIG) from the transducer is inputted to the integrator 34. After it counts the preselected number of clock pulses from that point, the timer/counter 52 sends another signal to the control logic circuit 46 to have the switch 40 disconnect the voltage (SIG) from the integrator 34. In this first phase, which is represented by the SIGNAL INTEGRATE portion of the drawing of FIG. 2, the output of the integrator 34 is an increasing ramp. The peak of the ramp (at point A) represents the average value of the amplified analog input voltage (SIG) from the transducer over the entire integration period.

In a steady state or near steady state condition for the analog input voltage (SIG), the longer this integration period is, the closer this average voltage value (at point A) will be to the actual analog voltage (SIG) from the transducer 12 as amplified by amplifier 30.

The second part of the sequence is REFERENCE DEINTEGRATE phase. When the switch 40 switches away from the analog voltage (SIG), it automatically switches to the reference voltage, which is then applied to the input of the integrator 34. It is deintegrated because the microcomputer 18 through the control logic circuit 46 provides a polarity control signal to the reference voltage circuit 42, which reverses the polarity of the reference voltage with respect to the analog voltage from the transducer. If the polarity of the two voltages are already opposites, there is no further reversal by the reference voltage circuit 42.

The time period for deintegration varies. The period reflects the time necessary for the magnitude of the reference voltage to return the integrator 34 to its initial reference value. That will depend on the magnitude of the analog signal voltage (SIG) used to integrate in the first place. The greater the analog voltage from the transducer, the longer it takes the fixed reference voltage to in effect deintegrate back to the integrator's starting point.

That variable time, however, is measured by the microcomputer 18. The reason is that it allows the microcomputer 18 to compute the value of the analog signal voltage (SIG) which was just integrated.

The following equation applies:

$$V(SIG) = V(REF) \times \frac{\text{time of deintegration}}{\text{time of integration}}$$

As a practical matter, since the reference voltage does not change, and the time of integration is preselected and fixed by the microcomputer 18, the time for the deintegration provides the final number for the equation. In essence, a comparison of the integration and deintegration times allows the microcomputer 18 to generate and store a digital value which corresponds to the signal voltage (SIG) from the transducer 12.

The third and final portion of the conversion is called AUTO ZERO. The deintegration results in a zero crossing in FIG. 2. The comparator 48, which receives the output of the integrator 34, makes a high to low transition at this zero crossing. This signals the microcomputer 18 that the integration-deintegration is complete. After a fixed period, the AUTO-ZERO time, the microcomputer 18 directs the switch 40 to connect the analog signal voltage (SIG) to the input of the integrator 34, and the process repeats to make the next conversion.

Figure 3:
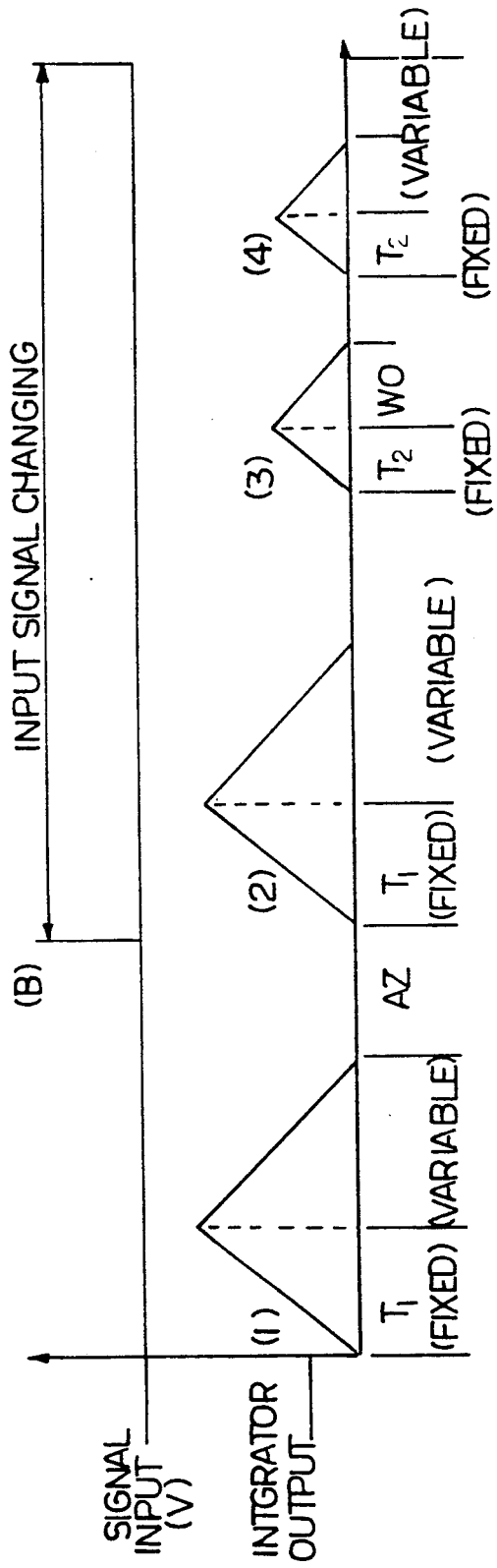
FIG. 3 is a diagram of a series of conversions compared to the actual input voltage being integrated.
Figure 3:
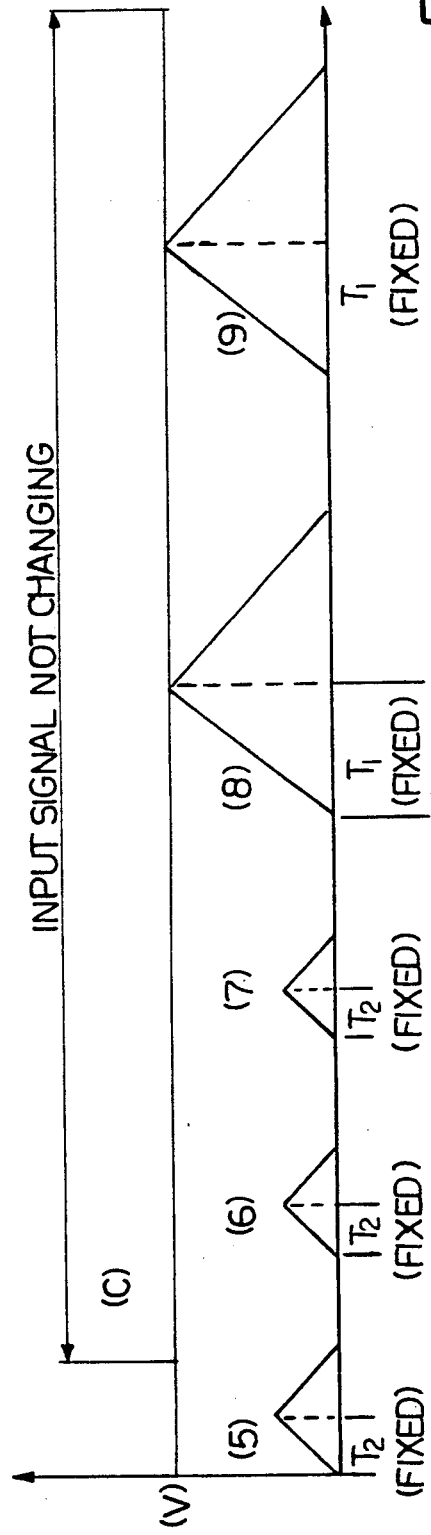

With reference to FIG. 3, a sequence of successive conversions is shown. Each represents the output of the integrator 34. Initially, the analog signal voltage (SIG) is not changing. The initial conversion (labeled 1) is made, as described with reference to FIG. 2, and the microcomputer 18 determines a digital number (based on the deintegration time) which corresponds to the magnitude of the analog signal voltage being integrated. At the time the next conversion (labeled 2) begins, the analog signal voltage has decreased in magnitude. Consequently, the peak of the second conversion is not as high as in the first conversion, and as a result, the deintegration period is shorter for the second. This deintegration period is counted by the microcomputer 18, which now assigns a digital value (Y) to it. The microcomputer 18 compares digital values (X and Y) derived from the deintegration times of these two conversions from which it can determine that the analog signal voltage (SIG) from the transducer 12 is changing. It makes no difference whether the change is an increase or a decrease, although the magnitude of the charges may make a difference, as hereinafter explained.

Once the microcomputer 18 detects that at least a preselected amount of change in the analog signal voltage (SIG) has occurred (a difference of 4 counts per 50,000 in the preferred embodiment but other differences may be selected), it reduces the integration period for the integrator 34. This means that the timer/counter 52 counts up far fewer clock pulses before the switch 40 is connected to the reference voltage. The second integration period, which is also fixed $T_2$, is significantly reduced, as shown in the conversions labeled 3–7 of FIG. 3. The deintegration periods are, of course, correspondingly less as well, but they may vary as before. While the accuracy of these conversions is less than before because the integration periods are less, the conversions are now made at a much higher rate (15 per second) than before (5 per second). Consequently, the more rapid conversions provide a more rapid reflection of the changing conditions to the operator. Any conversion rates can, of course, be selected.

Returning to FIG. 3, at the fourth conversion, the signal voltage is still changing (decreasing). The microcomputer 18 continues to compare the deintegration times of the sequential conversions (labeled 3, 4), and as before, there is a difference as the analog signal voltage is continuing to change. As a result, the microcomputer continues to enable the integration only at the much shorter, fixed period $T_2$. A comparison of the deintegration times for conversions 4 and 5, shown in FIG. 3, reveal the same thing, and thus conversion number 6 is also made with the reduced integration time $T_2$.

At point C on FIG. 3, however, the analog signal voltage has stabilized again. Conversion number 6 is made with the stabilized voltage, but the microcomputer's comparison of the deintegration times of conversion number 6 with number 5 still reveal a difference. As a result, conversion number 7 is made at the reduced integration rate $T_2$. However, as the analog signal voltage being integrated in conversion numbers 6 and 7 is the same, their respective deintegration times will also be the same (or less than the threshold of 4 counts per 50,000), which tells the microcomputer 18 that the signal voltage is no longer changing. Accordingly, the microcomputer 18 goes back to the longer, fixed integration time $T_1$ for conversion numbers 8 and 9. The longer integration time $T_1$ will be used until the microcomputer 18 again senses a change in the analog signal voltage. As a result, a more accurate reading is provided when the signal voltage is not changing because the integration period is longer (and the result is the average voltage over that longer period). On the other hand, signal voltage changes are more rapidly reported because of the automatic switch to the shorter integration period and more numerous conversions under changing conditions.

In the preferred embodiment, the switch in integration times was made between only two fixed periods $T_1$, $T_2$. Depending on the amount of change of the signal voltage, the switch can be made between any number of such preselected, fixed periods, with the very shortest periods for the greatest changes and intermediate periods for lesser changes.

In each case, however, the change is automatic, and the net result does not involve a compromise between high resolution and high speed.

Other embodiments and variations will be apparent from the foregoing.

What I claim is:

1. An analog to digital converter circuit for use in measuring systems wherein a parameter or parameters to be measured may be constant or may change and where high resolution is desired where the parameter is constant and high speed conversion is desired where the parameter is changing, comprising:
   a means for measuring,
      said means for measuring generating an analog output signal having a magnitude which is related to the parameter being measured;
   a conversion means for converting the analog output from said means for measuring to a digital signal,
      said conversion means including integration means for integrating the signal from said means for measuring, an output of said means for measuring being connected to said integration means;
   a comparison means for sensing the output of said means for measuring at a selected time and comparing it with the output of said means for measuring at an earlier selected time to determine an amount of change in the relative magnitudes of the outputs from said means for measuring, and based on that comparison controlling the length of time said integration means integrates subsequent outputs from said means for measuring, whereby when the output is constant, a longer integration time is used for high resolution and when the output is changing by more than a preselected amount, a shorter integration time is used for higher speed.

2. The circuit of claim 1 wherein said means for measuring comprises a transducer.

3. The circuit of claim 2 wherein said transducer comprises a strain gage having an output which is an analog voltage proportional to the magnitude of the force applied to said strain gage.

4. The circuit of claim 1 wherein said conversion means includes a reference signal means, said reference signal means generating a reference signal which is connected through a switch means to selectively apply said reference signal to said integration means.

5. The circuit of claim 4 wherein said means for measuring is also connected to said switch means, said switch means being arranged so that the output of said means for measuring and the reference signal may be sequentially applied to an input of said integration means.

6. The circuit of claim 5 wherein said integration means generates a series of analog to digital conversion signals, each of which comprises at least in part an integration of the output of said means for measuring over a preselected time period.

7. The circuit of claim 6 wherein the conversion signals each also comprise, after a portion representing an integration of the output of said means for measuring, a portion representing a deintegration of the reference signal.

8. The circuit of claim 7 wherein the time for each deintegration of the reference signal is variable and depends upon the magnitude of the integration of the output from the means for measuring.

9. The circuit of claim 8 wherein said comparison means compares the deintegration times for different conversion signals.

10. The circuit of claim 8 wherein said comparison means compares the deintegration times for each successive pair of conversion signals.

11. The circuit of claim 9 wherein said switch means has a variable period.

12. The circuit of claim 11 wherein the period of said switch means is controlled by said comparison means, said switch means having a first reduced switching period and a second longer switching period.

13. The circuit of claim 12 wherein whenever a comparison of the deintegration times of the previous two conversions exceed a preselected threshold amount so as to indicate a change in the output of said means for measuring, said comparison means selects the first reduced switching period during which said switch means connects the output of said means for measuring to the input of said integration means, thereby reducing the integration period and increasing the number of conversions in a given time period.

14. The circuit of claim 13 wherein whenever a comparison of the deintegration times of the previous two conversions does not exceed a preselected threshold amount so as to indicate a steady state or near steady state condition in the output of said means for measuring, said comparison means selects the second longer time period during which said switch means connects the output of said means for measuring to the input of said integration means thereby increasing the integration period and increasing the resolution of the conversion.

* * * * *